United States Patent
Johnson et al.

(10) Patent No.: US 6,434,716 B1
(45) Date of Patent: Aug. 13, 2002

(54) NETWORK LINK TESTER DEVICE CONFIGURED TO SELECTIVELY AND AUTOMATICALLY COUPLE TO A NETWORK TRANSMIT PAIR LINE OR A NODE TRANSMIT PAIR LINE OF A LAN PORT AND DETERMINE AVAILABLE OPERATIONAL MODES

(75) Inventors: Darrell J. Johnson, La Mesa; John C. McCosh, San Diego, both of CA (US)

(73) Assignee: Psiber Data Systems Inc., La Mesa, CA (US)

( * ) Notice: Subject to any disclaimer, the term of this patent is extended or adjusted under 35 U.S.C. 154(b) by 0 days.

(21) Appl. No.: 09/240,154

(22) Filed: Jan. 29, 1999

(51) Int. Cl.[7] ............................................. G01R 31/28
(52) U.S. Cl. ...................... 714/712; 714/714; 714/715; 709/223; 709/224; 370/213; 370/465
(58) Field of Search ................................. 714/712, 714, 714/715; 370/465, 213, 474, 296, 463; 709/235, 223, 224

(56) References Cited

U.S. PATENT DOCUMENTS

| 5,311,114 | A | * | 5/1994 | Sambamurthy et al. ...... 370/296 |
| 5,446,914 | A | * | 8/1995 | Paul et al. ................... 709/235 |
| 5,548,728 | A | * | 8/1996 | Danknick ............... 395/242.92 |
| 5,583,874 | A | * | 12/1996 | Smith et al. .................. 714/712 |
| 5,610,903 | A | * | 3/1997 | Crawford ..................... 370/213 |
| 5,729,548 | A | * | 3/1998 | Holender ..................... 370/474 |
| RE36,182 | E | * | 4/1999 | Bowers et al. ........... 395/200.5 |
| 5,940,771 | A | * | 8/1999 | Gollnick et al. ............. 455/517 |
| 6,067,585 | A | * | 5/2000 | Hoang .......................... 710/11 |
| 6,087,835 | A | * | 7/2000 | Haneda ....................... 324/539 |
| 6,138,080 | A | * | 10/2000 | Richardson ................... 702/79 |
| 6,178,178 | B1 | * | 1/2001 | Wallace et al. ............. 370/465 |
| 6,222,852 | B1 | * | 4/2001 | Gandy ......................... 370/463 |

* cited by examiner

Primary Examiner—Zarni Maung
Assistant Examiner—Nabil El-Hady

(57) ABSTRACT

A network link tester couples to a LAN port with the LAN port having both a network transmit pair and a node transmit pair line. The link detector scans the network transmit pair and node transmit pair lines for the presence of link signals. Upon finding a link signal, the link tester indicates if the link signals were on the network transmit pair or on the node transmit pair line. Further, the link tester determines the network standard used and identifies the available operational nodes. The process of using a LAN tester includes coupling the tester to the LAN port, scanning network lines for the presence of link signals and determining and displaying operational capabilities. Optionally, the link tester may generate a tone signal on the network lines to assist in identifying line faults. Further, the link tester may generate link signals responsive to receive link signals.

16 Claims, 7 Drawing Sheets

NETWORK LINK TESTER DEVICE CONFIGURED TO SELECTIVELY AND AUTOMATICALLY COUPLE TO A NETWORK TRANSMIT PAIR LINE OR A NODE TRANSMIT PAIR LINE OF A LAN PORT AND DETERMINE AVAILABLE OPERATIONAL MODES

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Technical Field

The field of the present invention is network testing devices and method of using same. More particularly, the present invention relates to a Link tester for assisting in establishing a link between devices on a network.

2. Background Art

Computer networks are generally used to interconnect computing devices, thereby allowing the sharing of resources and information. The use of networks has escalated as computer and networking technology advances. One of the most popular methods of establishing a network is to interconnect computing devices and resources using a Local Area Network (LAN). To assist the interconnection of computing devices, standards have evolved for interoperability. One of the most popular standards for establishing interoperability on a local area network is the Ethernet Standard. The Ethernet Standard has advanced over the years from operating at speeds of a few megabits per second to currently operating at 100 megabits per second, with higher speed standards expected in the near future. Ethernet is so widely accepted that standards organizations such as the Institute of Electrical and Electronic Engineers (IEEE) have codified United States and international standards around Ethernet. For example, the IEEE organization has established IEEE 802.3u as the most widely recognized and accepted standard in the design and installation of 100 megabit Ethernet.

Compliance by manufacturers to the Ethernet standards is voluntary and many of the new features specified in the standard have been defined only as optional requirements. Thereby devices complying with standards may still have varying capabilities. The IEEE 802.3u standard maintains equipment interoperability even with variation in LAN product capabilities by including a Physical Layer signaling scheme.

Signaling is used as a handshake between two connected pieces of LAN equipment (Link Partners) and is accomplished by exchanging a burst of pulses called Fast Link Pulses (FLPS) that form a Link Code Word. The Link Code Word describes the capabilities and fault status of the transmitting equipment which is compared to the capabilities of the receiving equipment. A Link is then established based on the highest common mode of operation. The process of establishing a Link by exchanging Link Code Words is called Auto-negotiation and must be completed prior to any data being transmitted.

The Link Code Word consists of 16 encoded data bits that provide detailed information about the transmitted equipment. The first word transmitted is the base Link Code Word which identifies the type of message being sent, the capabilities of the Link Partner, equipment fault status, received Link Code Word acknowledgment and support for additional Link Code Word information called Next Page. Once the Link Partners have exchanged the base Link Code Word, the capabilities are compared and a Link is established based on the highest common mode of operation. The following is the operating mode priority from highest to lowest:

1. 100baseTX Full Duplex
2. 100base T4
3. 100base TX Half Duplex
4. 10baseT Full Duplex
5. 10baseT Half Duplex Additional information may be exchanged between Link Partners that support the Next Page function. Next Page information is typically vendor specific for the equipment.

A significant amount of 10 megabit Ethernet and Fast Ethernet equipment was installed in the field prior to the time when the IEEE 802.3u standard was finalized. Some of this equipment does not support the FLP scheme of handshaking but instead establishes a Link by continuously transmitting an "idle" data packet using the Fast Ethernet MLT-3 waveform. This form of Link Signaling is called Parallel Detection. When a Link Partner that supports Autonegotiation receives a Parallel Detection signal, it will disable its FLP bursts and transmit the same Parallel Detection waveform to setup the Link. Equipment that does not support Auto-negotiation must be configured to exactly match the mode of operation as the Link Partner or else no Link can be established and the equipment will report that there is no connection to the network.

Standard ethernet (10baseT) uses a signaling scheme based on a single pulse called a Normal Link Pulse (NLP). The NLP is transmitted continuously by the Link Partners every 8 to 24 milliseconds, except during data transmission, to maintain the Link. Recently, 10baseT equipment that use the FLP method of establishing a Link have been introduced. These new products support Autonegotiation by exchanging Link Code Words and can automatically select half duplex or full duplex modes based on the highest common mode of operation.

Many types of LAN equipment allow the user to set the speed (10 Mbs or 100 Mbs) and duplex mode (half of full) of an individual port or device. The IEEE 802.3u standard does not specify what type of Link Signaling should be used when a port or device is commanded to a specific operating mode. Testing of various equipment has shown that the Parallel Detection waveform or the NLP are commonly used to establish Links when the equipment is configured to a commanded operating mode. The Parallel Detection waveform and NLP are specific regarding the speed of the Link but are ambiguous as to which duplex mode has been selected.

Link problems can occur when one Link Partner is configured to full duplex operation and the other Partner is set for Auto-negotiation and the Parallel Detection or NLP Link signals are used. The Auto-negotiating Link Partner will correctly set the Link speed but will assume a half duplex mode based on the ambiguous signal type. The Link will perform poorly or will be disabled due to high error rates and excessive collisions. Links that use Parallel Detection/NLP signaling should use one of the following configurations (both Link Partners have same speed capability):
1. Both Link Partners in Auto-negotiation Mode.
2. Both Link Partners in Full Duplex Mode.
3. One Link Partner in Half Duplex Mode and one Link Partner in Auto-negotiation Mode.
4. Both Link Partners in Half Duplex Mode.

Fast Ethernet is a powerful standard gaining widespread acceptance. However, with the rapid advancements in technologies and progressing standards, a need exists for compatibility with existing devices. This is primarily driven by business economics where companies will not generally incorporate new technologies that fail to be backwardly compatibility with the installed base of existing computer devices and network infrastructure. Backard comparability thereby allows for a slow phase-in of the new technology. Consequently, as companies, governments, and other users begin to incorporate new technologies, such as the IEEE 802.3u standard, the network environment will have equipment with varying capabilities. For example, the network may have a department where users have new computers capable of supporting the new 100 megabit Ethernet standards. However, the internal infrastructure of the network may still only support the older 10 megabit standard. Indeed, as sections of the network are updated with newer technologies, it is likely that a single network may simultaneously be required to support several versions of the Ethernet Standard.

Complicating matters further, a user may in some circumstances manually set the operating mode for particular network devices. For example, a new personal computer may have a Network Interface Card (NIC) capable of supporting the 100 megabit Ethernet Standard. However, a user may, by accident or through ignorance, configure the 100 megabit per second card to operate at a maximum of 10 megabits per second. Indeed, under the IEEE 802.3u standard devices may be manually configured to operate at one of several operational modes. Therefore, although a device may have a maximum operational mode of 100 megabits per second, for various reasons, the device may be configured to operate at a less than maximum operational mode.

Further, on a network communication between two devices will occur at the highest common mode of operation. For example, if a 100 megabit per second NIC connects to a hub or router configured only for 10 megabits per second, the communication between the NIC and hub will occur at the lower rate of 10 megabits per second. Thereby, a single misconfigured slow device on the network may artificially lower effective communication rates significantly.

In establishing the network infrastructure for a computer network, an installer first provides cabling for physically interconnecting computing devices. Most often such cabling is done by running a properly rated cable through walls, ceilings and floors for interconnecting remote devices in an inconspicuous manner. Because users and computer devices in an organization are often moved or modified, it is inconvenient to permanently attach computing devices to the network. Therefore, the infrastructure wiring typically enters a work area or network closet at a LAN port. This LAN port is often simply a standard RJ-45 jack which allows for the quick and easy insertion and extraction of a complimentary mating connector. Indeed, it is common to see wall outlets with several RJ-45 couplers. In such a manner, each RJ-45 may provide a physical connection to a different computing device or network device. Further, since the RJ-45 may be used for uses other than computer networking, it is even possible that one or more of the RJ-45 sockets are not even connected to network related equipment. Unfortunately, when a user or computer technician intends to connect a device to these RJ-45 jacks, it is difficult to determine if a particular RJ-45 jack connects to a computing device or connects to the network, probably at a hub or switch. Further, the jack may not even be network related, but connect to a PBX phone system or other device. Such ambiguity causes users and computer technicians considerable problems.

For example, if a computer user attaches a computer NIC to the RJ-45 jack, the network connection will not work if that RJ-45 jack is not connected to the network. In such a case, the computer user will likely call for computer support. The responding computer technician will have to determine why the computer is not able to access the network. The first step in the trouble-shooting process is to determine what the RJ-45 jack connects to. However, making this determination is neither quick nor easy.

Others have tried to solve this problem. For example, U.S. Pat. No. 5,583,874 provides a portable link tester. However, the portable link tester has two connectors, one labeled "PC," the other labeled "Hub." Thereby, the computer technician must know what is connected to the RJ-45 jack before using this device. Further, this device only looks for NLP's. It will incorrectly display an inoperative link when the far end device transmits on FLP or MLT-3 waveform.

Besides the ambiguity in what the RJ-45 jack is connected to, the computer technician also faces the task of determining the configuration for the unknown device at the far end of the RJ-45 jack. For example, if the RJ-45 jack attaches to a hub or router at the far end, then the computer technician must determine the switches' or hub's present configuration. Similarly, if the RJ-45 jack is connected to a NIC, then the computer technician will want to know the presently configured operational mode. Additionally, if the network technician is in a network closet trying to troubleshoot a connection problem, they not only need to verify that the physical connection to the computer is properly functioning, but need to determine that the communication is operating at the most efficient operational mode. Typically, this means the computer technician will have to leave the network closet, find the appropriate wall socket, open the computer to verify equipment type and model, and run a software program to determine current settings. Thus, verifying computer configuration is time consuming and burdensome.

Therefore, a need exists for an easy to use diagnostic tool for identifying network or device connections and quickly determining available operational modes and device configuration.

SUMMARY OF THE INVENTION

It is therefore an object of the present invention to provide an easy to use network link tester for determining if a LAN port couples to a computing device or to the network. It is a further object of the present invention to easily and quickly determine the configuration of the network device coupled to the LAN port, including the configured operational modes.

To overcome the disadvantages in the prior art and meet the above objective, a novel link tester and method is herein provided. A network link tester couples to a LAN port with the LAN port having both a network transmit pair and a node transmit pair line. The network transmit pair is typically found on network cable wire pair 3, 6 and the mode transmit pair is typically found on wire pair 1, 2. The link detector scans the network transmit pair and node transmit pair lines for the presence of link signals. Upon finding a link signal, the link tester indicates if the link signals were on the network transmit pair or on the node transmit pair line. Further, the link tester determines the network standard used and identifies the available operational nodes. The process of using a LAN tester includes coupling the tester to the LAN port, scanning network lines for the presence of link signals and determining and displaying operational capabilities. Optionally, the link tester may generate a tone signal on the network lines to assist in identifying line faults. Further, the link tester may generate link signals responsive to received link signals.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
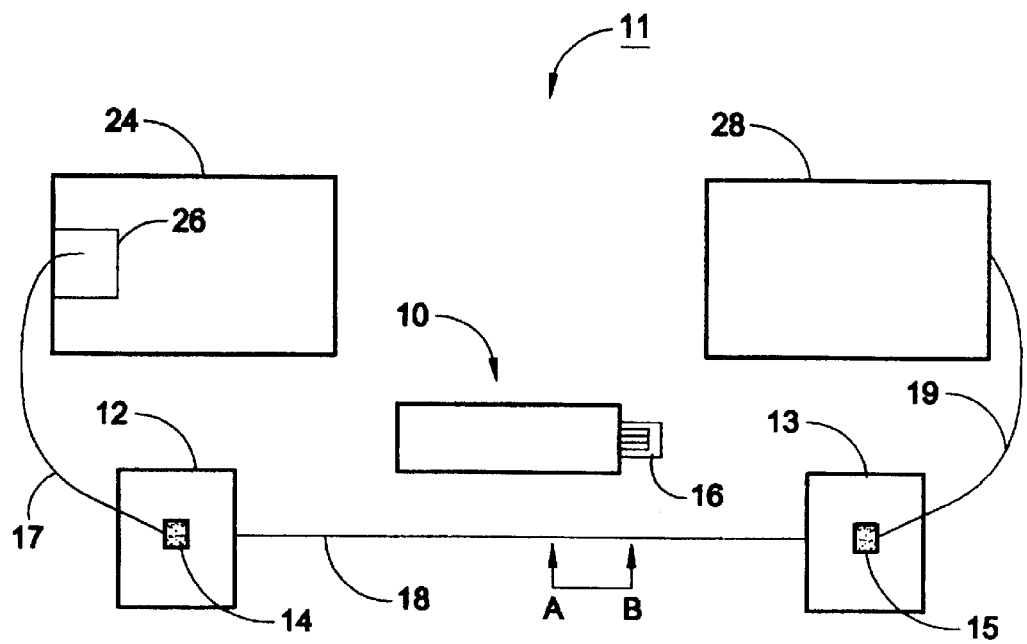
FIG. 1 is a block diagram showing a network environment in which a Link tester made in accordance with the present invention may operate.
Figure 3:
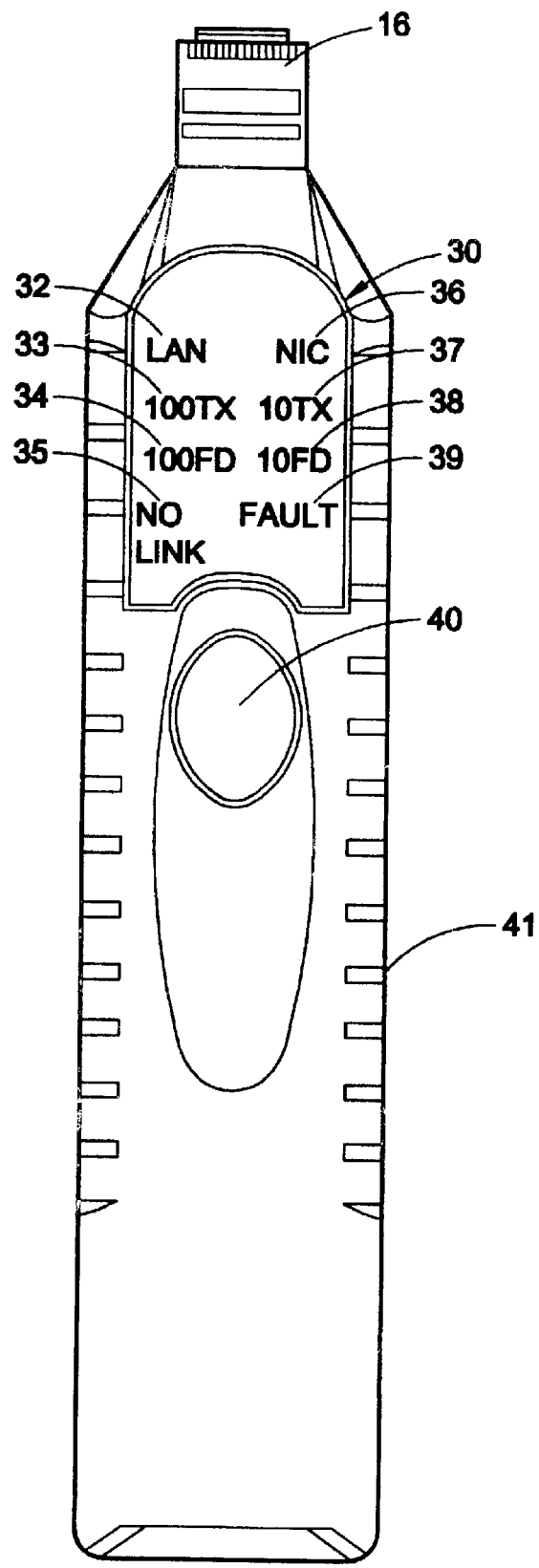
FIG. 3 shows a diagram of a Link tester made in accordance with the present invention.

FIG. 3 shows a link tester 10 constructed in accordance with the present invention. The link tester 10 is for use in troubleshooting and optimizing computer networks. For example, FIG. 1 shows a network environment 11 wherein a network cable 18 connects LAN port 14 to LAN port 15. LAN port 14 terminates at wall socket 12 and LAN port 15 terminates in wall socket 13. Both LAN ports 14 and 15 are RJ-45 compatible jacks. In such a manner, cable 17 connects RJ-45 jack 14 to the network interface card (NIC) 26 of computer 24. In a similar manner, cable 19 connects RJ-45 jack 15 to a hub or router 28. The link tester 10 has an RJ-45 connector in the form of an RJ-45 plug 16 configured to mate with the RJ-45 jacks 14 and 15. Thereby, computer technician may couple the link tester 10 to the network cable 18 in a fast and efficient manner.

Referring again to FIG. 3, the link tester 10 generally comprises a housing 41 for supporting the RJ-45 plug 16 and the display 30. Further, the housing contains a test button 40 for activating a network link test. When the RJ-45 plug 16 is mated to a LAN port such as RJ-45 jack 14 or 15, the display 30 will indicate the type and operational configuration status for any found device. Further, if no device is found or if a fault is detected, such indication is also made on the display. For example, if no device is found, the "No Link" indicator 35 will illuminate. In a similar manner, if a fault is detected the "Fault" indicator 39 will be illuminated.

If the link tester 10 determines the target LAN port being tested is connected to a network device such as hub or switch 28, the "LAN" indicator 32 illuminates. On the other hand, if the LAN port couples to a computer device 26, then the "NIC" indicator 36 illuminates. Once a device has been found and has been indicated to be a LAN device or a NIC device, then the configured operational modes for the LAN or NIC are shown.

The link tester 10 preferably detects and identifies four different operational modes: 10BaseT half duplex with the "10TX" indicator 37; 10BaseT full duplex with the "10FD" indicator 38; 100BaseT half duplex with the "100TX" indicator 33; and 100BaseT full duplex with the "100FD" indicator 34. Those skilled in the art will recognize that other operational modes could be identified. For example, the link tester 10 could be configured to check for the presence of other emerging or existing standards, 100BaseT 4, token ring, an ISDN, or even the presence of a PBX or phone line.

Figure 2:
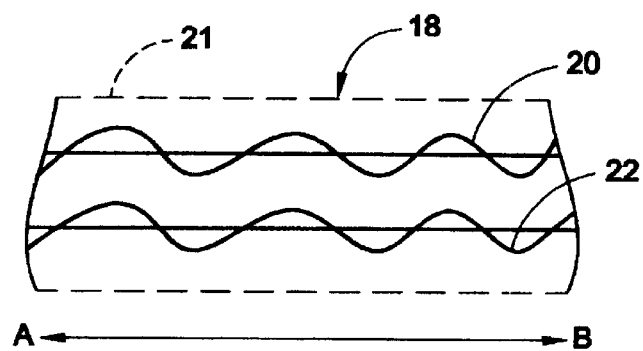
FIG. 2 is a diagram showing twisted pair lines within a network cable.

FIG. 2 shows a section of network cable 18 as indicated by arrows A–B in FIG. 1. The network cable 18 is typically a standard network cable meeting industry standards, such as the common category 5 cable. As such, the network cable 18 has a plurality of twisted pair wires within its jacket 21. The network cable 18 has at least two sets of twisted pair. A network transmit wire pair 20 is used to transmit signals from the network device to the node and is therefore referred to as the network transmit pair 20. In network terms, a "node" is a LAN port where the network interfaces to a computing device. For example, the RJ-45 jack 14 shown on FIG. 1 is a node. Referring again to FIG. 2 the cable 18 further comprises a node transmit pair twisted pair 22. This twisted pair is used to transmit communications from the node to the network device.

To use the tester, insert the Link Tester plug end 16 in to the RJ-45 port of a hub, switch, network interface card, wall outlet, or attach to a UTP or STP cable with an RJ-45 coupler. Press and hold the "TEST" button 40. The first wire pair (network transmit pair) is scanned for two seconds. If Link signals are detected, the indicator(s) for the operational modes or fault condition are illuminated on the display 30. If multiple operational modes are displayed, then the link partner is configured for auto-negotiation. If no signals are detected on the first wire pair, the unit scans the second wire pair (node transmit pair) for two seconds. Link signals are decoded and the indicator(s) for the modes or fault are lit as indicated above.

If no signals are detected, the "NO LINK" indicator is illuminated. The Link Tester also detects Links with incorrectly installed reversed polarity pairs and displays "NO LINK" for this condition.

Figure 5:
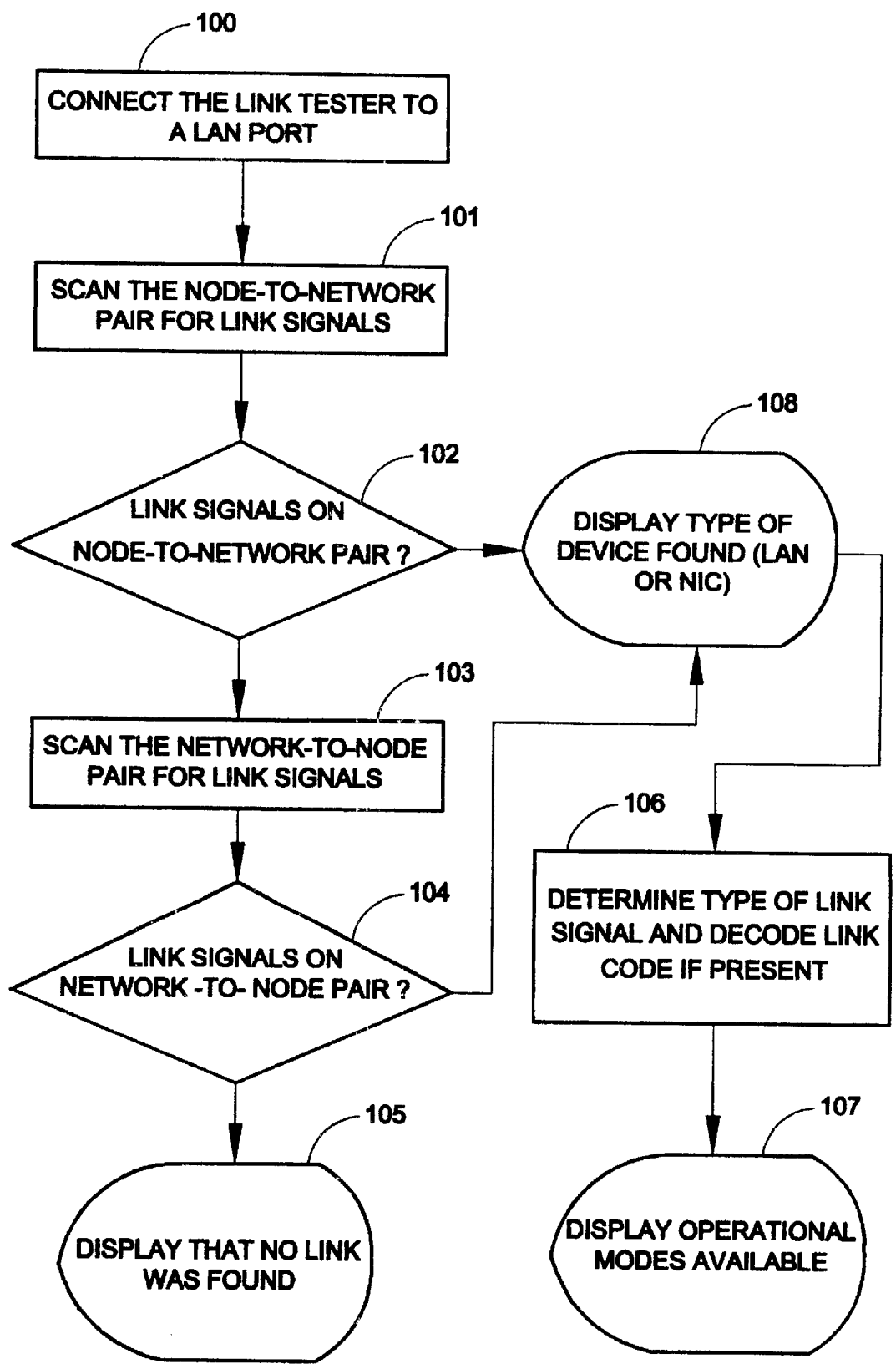
FIG. 5 is a flow chart of a method using a Link tester made in accordance with the present invention.

FIG. 5 shows a flow chart of a method of using the link tester 10. As indicated at block 100 the link tester is connected to a LAN port. As the preferred link tester is a hand held device with an RJ-45 plug attached to its housing, a computer technician simply unplugs any existing cable from the LAN port and inserts the RJ-45 plug of the link tester 10 into the LAN port jack. As mating RJ-45 connectors have a positive snap coupling means, the LAN tester is securely but removeably coupled to the LAN port.

With the link tester in the LAN port, the link tester is activated, and as shown in block 101, the link tester scans the network transmit pair twisted pair for the presence of any link signals. The network transmit pair is tested first as it is more likely that the RJ-45 jack connects to the network, and not a computing device. By checking this pair first, the overall test is made faster and more efficiently. If link signals are found on the network transmit pair twisted pair, than the LAN indicator 32, is illuminated as shown in block 108. In block 106 the link tester then determines the type of link signal and illuminates in block 107 the appropriate indicator or indicators 33, 34, 37 or 38. The illuminated indicators correspond to the modes of operation available at the link partner.

If a link signal is not detected on the network transmit pair, then the link tester scans the node transmit pair for link signals in block 103. If link signals are found on the node transmit pair in block 104, then the NIC indicator 36 is illuminated as shown in block 108 and the operational modes determined in block 106. As above, the appropriate operational mode(s) 33, 34, 37 or 38 are illuminated. When illuminating the operational modes, if the detected device is configured for one specific mode, that single operational light will be illuminated. However, if the far end device is determined to be an auto negotiating device, then all available operational modes will be illuminated.

If link signals are not found on either the network transmit pair or the node transmit pair, then block 105 indicates that the "no link" indicator 35 will be illuminated.

Figure 4:
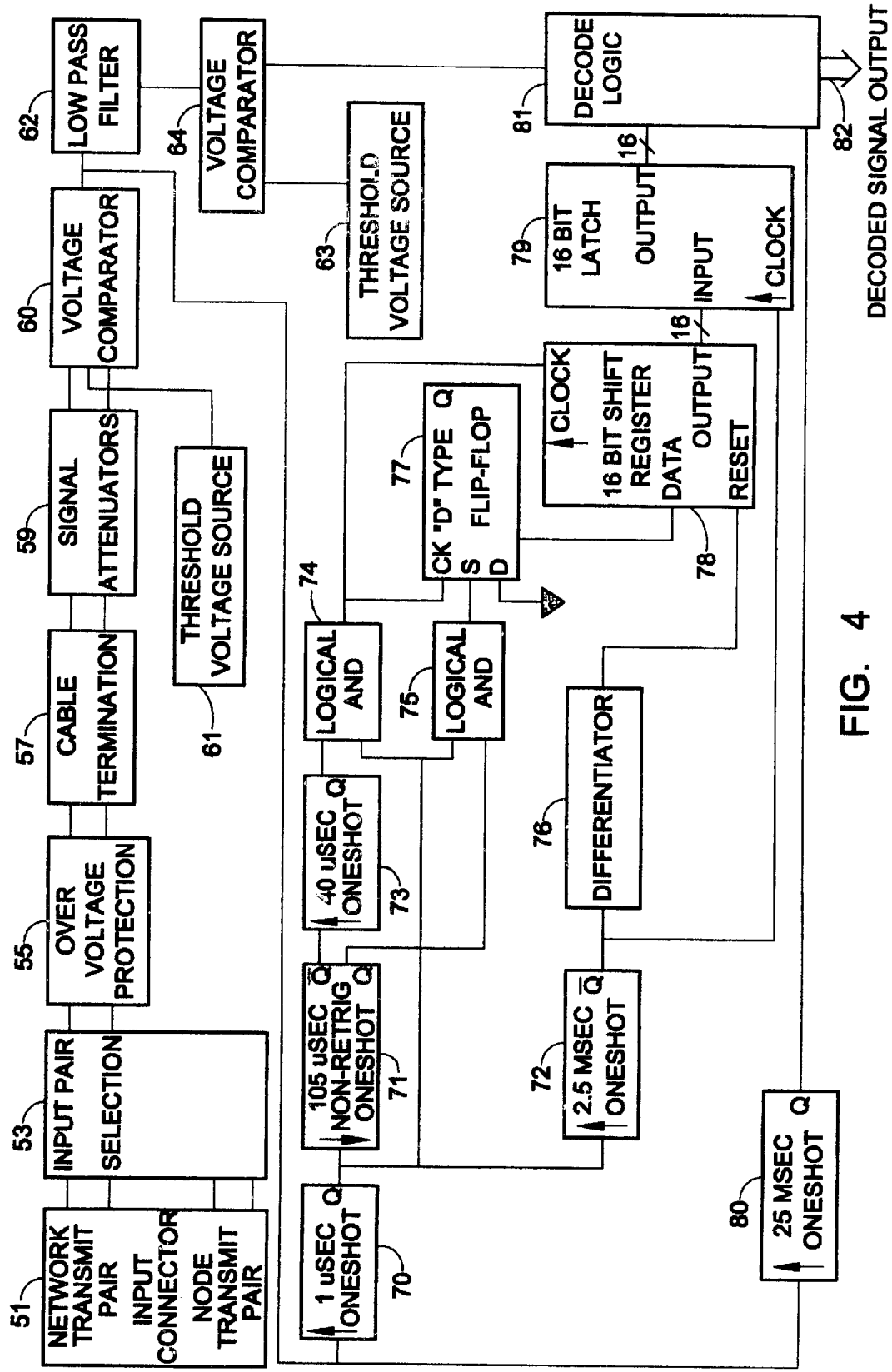
FIG. 4 shows a functional block diagram of a Link tester made in accordance with the present invention.

FIG. 4 shows a functional block diagram for a link tester made in accordance with the present invention. FIG. 4 indicates there is an input connector at block 51 for inputting transmit pairs and receive pairs. The transmit pairs correspond to what has previously been described as the node transmit pair twisted pair lines and the received pairs corresponds to the network transmit pair twisted pairs line.

The connector indicated at block 51 is preferably an RJ-45 plug attached to the housing of a link tester. However, the input connector may also be adapted to be an RJ-45 jack for accepting inputs from a patch cord. Further, those skilled in the art will recognize that other input connector means exist for connecting to local area networks.

The node transmit pair lines 95 and network transmit pair lines 96 are received at an input pair selector 53. The input pair selector 53 enables the link tester to first select the network transmit pair lines for scanning an analysis and after completion of the network transmit pair analysis select the node transmit pair lines 95 for scanning and analysis. The input pair selector 53 is preferably a mechanical relay but those skilled in the art will recognize that other methods exists for providing an input pair selector. For example, mechanical, electromechanical, electrical, or solid state switch devices may be used to provide input pair selection.

Further, in the preferred embodiment the input pair selection is done immediately after the line pairs are input in block 51. Those skilled in the art will recognize that the link tester could provide such selection at other points in the scanning and analysis circuitry. In such a case the node transmit pair and the network transmit pair would each have similar circuitry preceding the input pair selector. After the input pair selector the node transmit pair and network transmit pair lines would share circuitry sequentially.

Block 55 provides over-voltage protection for the link tester. Such over-voltage protection provides protection against the inadvertent application of unexpected voltages initiated at the input 51. Such over-voltage may come from faults on the network line or the inadvertent attachment of the link tester to a non-network line such as a phone line. The over voltage protection 55 thereby protects the circuitry subsequent to block 55.

Block 57 provides a cable termination means for the link tester. By properly terminating the cable the link tester minimizes interference with the cable's characteristic impedance. Cable termination devices and methods are well-known in the art.

Block 59 provides signal attenuation to the selected twisted pair. Such attenuation reduces the signal on the twisted pair to a level compatible with subsequent circuitry. After attenuation the signal is received at voltage comparator 11. The voltage comparator is used to convert the transmit or receive signals into rectangular waveforms capable of driving the logic family used in subsequent signal detection and analysis circuitry. The voltage comparator 60 can be configured as either a differential comparator, measuring the differential voltage across the signal pair, or as a single ended comparator, comparing the voltage on either wire of the single pair to a threshold voltage. In such a manner, the threshold voltage is provided by a threshold voltage source 61. The signal from the voltage comparator 60 is received at the one micro second one shot block 70, by the low pass filter block 62, and the 25 millisecond oneshot block 90.

Blocks 62, 63 and 64 are used to indicate the presence of an MLT-3 line. These blocks operate on a theory that NLP and FLP signals are of a short duty cycle and an MLT-3 signal has an approximate 501 duty cycle. Thereby, as the rectangular signal emanating from the voltage comparator 60 is received in the low pass filter 62, the low pass filter outputs a signal that is generally DC in nature. In such a manner, if the low pass filter 62 is receiving an NLP or FLP signal, due to the low duty cycle, the output from the low pass filter 62 will be at a low DC level. However, if the low pass filter 62 is receiving the MLT-3 signal having a high duty cycle, the output from the low pass filter 62 will be a relatively higher DC voltage. By using voltage comparator 64 in conjunction with a properly adjusted threshold voltage source 63, the presence of a MLT-3 signal is detected. In such a manner, if an FLP or NLP signal is being received, the output from the voltage comparator will be a logical zero. However, if an MLT signal is being received, the output from voltage comparator 64 will indicate a logical one.

The signal from the voltage comparator 60 is also received at the one microsecond oneshot 70 and the 25 millisecond oneshot 80. The purpose of the one microsecond oneshot is to widen the narrow pulses from the output of the voltage comparator 60. The output from the one microsecond oneshot 70 produces a one microsecond wide pulse on every rising transition received from the voltage comparator 60.

The 25 millisecond oneshot 80 detects the presence of the NLP or FLP bursts. The NLPs and FLP bursts occur every 16 I 8 milliseconds. The output of the 25 millisecond oneshot 80 will remain high as long as NLP or FLP bursts are present. The output from the one microsecond oneshot 70 is received into the 105 microsecond non-triggerable oneshot 71, the 2.5 millisecond oneshot 72 and the logical AND gates 74 and 75. The output from the 25 millisecond oneshot 80 is received into the decode logic block 81.

The 105 microsecond nonretriggerable oneshot 71 receives the widened pulses from the one microsecond oneshot 70. The purpose of the 105 microsecond nonretriggerable oneshot 71 is to separate the data pulses from the clock pulses within an FLP burst. An FLP burst consists of 17 to 31 pulses. Seventeen of the pulses are clock pulses. The remaining zero to 16 pulses are data pulses which are inserted between the clock pulses. The presence of a data pulse indicates that the corresponding data bit is a one. The absence of a data pulse indicates that the corresponding data bit is zero. The 105 microsecond nonretriggerable oneshot 71 is triggered by the falling edge of the output of the one microsecond oneshot.

The 105 microsecond nonretriggerable oneshot produces a single 105 microsecond wide pulse when triggered and ignores any additional triggering pulses until the 105 microsecond oneshot period is completed. If a data pulse is present between two clock pulses, it will occur during the 105 microsecond period. The data pulse will not trigger the 105 microsecond nonretriggerable oneshot. The logical AND gate 75 combines the outputs of the one microsecond oneshot and the 105 microsecond nonretriggerable oneshot 71 to provide a pulse corresponding to an FLP data bit. Thereby the output from logic AND gate 75 represents the FLP data stream.

The 40 microsecond oneshot 73 is to separate the clock pulses from the data pulses within an FLP burst. The 40 microsecond oneshot 73 is triggered by the output of the 105 microsecond nonretriggerable oneshot 71. The 40 microsecond oneshot is triggered at the end of the 105 microsecond period. A clock pulse will occur during the 40 microsecond oneshot period. The logical AND gate 74 combines the outputs of the one microsecond oneshot and the 40 microsecond oneshot to provide a pulse corresponding to the FLP clock pulse. Thereby, the output of the logical AND gate 74 represents the FLP clock pulses. This clock signal from the logical AND gate 74 is used as a clock input to the flip flop 77. Further, the clock signal from the logical AND gate 74 is used as a clock input to a 16 bit shift register 78.

The D type flip flop 77 and 16 bit shift register 78 capture the FLP burst data bit. An FLP data bit from the AND gate 75 sets the output of the D type flip flop a logical high. An FLP clock bit from the logical AND gate 74 clocks the FLP data bit into the 16 bit shift register 78 and resets the output the D type flip flop 77 to a logical low. This process continues until 16 FLP data bits have been clocked into the 16 bit shift register.

The 2.5 millisecond oneshot 72 generates a data latch clock 2.5 milliseconds after the reception of the last FLP burst clock bit. The 2.5 millisecond oneshot is triggered by the output of the one microsecond oneshot 70. The output of the 2.5 millisecond oneshot will be driven to a logical low level by the first bit of the FLP burst or by an NLP pulse and will remain at a logical low until 2.5 milliseconds after the last FLP burst bit.

The 16 bit latch 79 stores the received 16 bit FLP data words captured by the 16 bit shift register 78. The FLP data is latched by the output of the 2.5 millisecond oneshot 72. The differentiator 76 generates a narrow pulse on the trailing edge of a 2.5 millisecond oneshot 72 output. The differentiators output resets the 16 bit shift register 79 after the 16 bit shift registers FLP data has been stored by the 16 bit latch 79.

The output on the 16 bit latch 79 is received into the decode logic block 81. The decode logic 81 determines if the stored FLP data word is from an IEEE 803.2u link partner by decoding the IEEE 803.2u selector field data bit and if so, decodes the IEEE 803.2u technology ability field and remote fault data bits for display. The decode logic 81 also decodes the stored data word produced by the reception of NLP's from a non auto-negotiating 10 BaseT link partner. The decode logic 81 monitors the state of the voltage comparators 64 output to determine the reception of an MLT-3 signal, indicating connection to a parallel detection scheme 100 BaseT system. Thereby, a decoded signal output is received at output 82.

Although the functional diagram shown in FIG. 4 anticipates the use of discrete logic in implementing the link tester. Preferably the link tester circuitry is implemented on a PLD device such as a gate array. Those skilled in the art will recognize that other methods of implementing the link tester exists. For example, the functions of the link tester may be implemented using a microprocessor operating a program to detect and decode the link signals, including generating return link signals and controlling a display. Further, various Ethernet chip sets are available from manufacturers which could assist in implementing the link tester circuitry. Also, advancing technologies suggests that digital signal processing may be utilized to implement the link tester. In such a manner the inputs from the LAN port would be digitized and processed by digital signal processing circuitry and algorithms. In such a manner, the link signals could be decoded and interpreted and appropriate link signals generated in response.

In the link test discussed thus far, the link tester is a passive device that only receives, identifies, and displays link pulse information. In an alternative embodiment the link tester also generates signals responsive to received link pulses. Thereby during the detection sequence described above, if link signals are found on the first wire pair, the Link Tester automatically transmits a pattern of Link signals to the Link Partner, which is likely a hub or switch. The "LAN" indicator blinks on and off as the signals are transmitted. The "Link" indicator on the hub, router, or switch at the far end will also blink indicating which port is connected to the Link Tester. As Hubs/switches have different Link indicator time delays, the blink rate of the equipment may not exactly match the blink rate of the Link Tester.

In a similar manner, if during the detection sequence link pulses are found on the second wire pair, the Link Tester automatically transmits Link signals continuously to the NIC. The "Link" light on the NIC will light or flash to verify two-way communication. After the detection process, if no link pulses are found in either wire pair, the Link Tester automatically transmits a tone pattern on both wire pairs. The "NO LINK" indicator blinks when the tone is being transmitted. A standard tone probe can then be used to locate the physical layer problem.

This alternative link tester also actively tests the auto-negotiation features if present on the link partner. When two or more operational mode indicators are lit, the Link being tested is capable of Auto-negotiating to the highest common level of operation with a Link Partner.

To test the auto negotiation feature of the link partner, the link tester generates and transmits a responsive link signal to the link partner. The responsive link signal configures the link partner to a specific operational mode. In response, the link partner sends out a link signal indicating it is now configured to a specific operational mode. Thereby, the display of the link tester first displays that multiple modes are available, and after a few seconds, the display changes to show only the single selected mode. By viewing this change, a computer technician verifies that the far end device is properly auto-negotiating.

Figure 6:
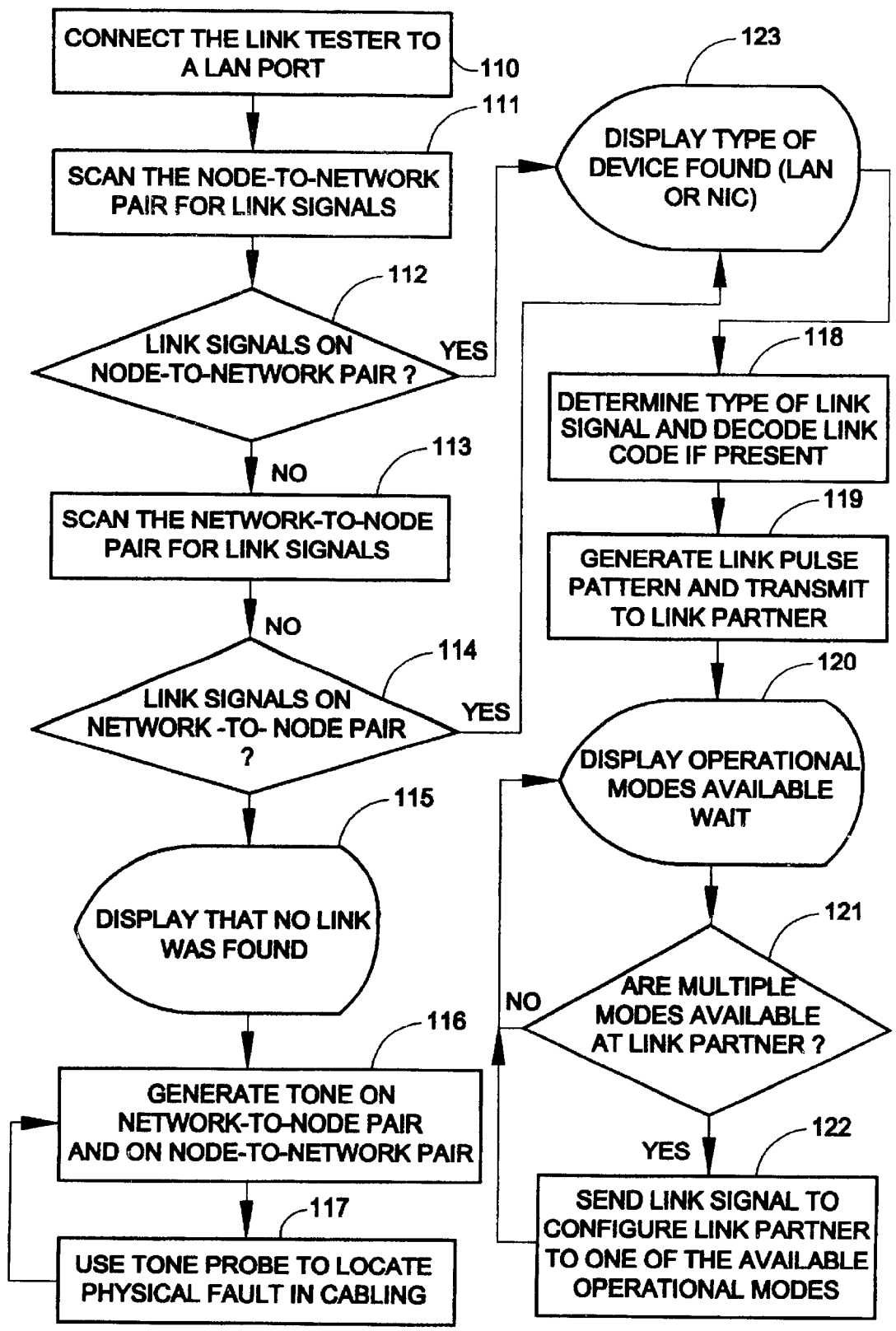
FIG. 6 is a flow chart of a method for using another tester made in accordance with the present invention.

FIG. 6 shows a method using the alternative link tester. The connection scanning and displaying functions indicated in blocks 110, 111, 112, 113, 114, 115, 118, 120 and 123 are similar to the features of the method shown in FIG. 5 blocks 100, 101, 102, 103, 104, 105, 106, 107, and 108, respectively. However, the method of FIG. 6 additionally includes the generation of several signals responsive to the detection process already described.

For example, the tester using the alternative method may generate a tone on both the node transmit pair and the network transmit pair as shown in block 116. Thereby, if no link signals are found on the LAN port, then the link tester generates a tone back on the twisted pairs. Then using a tone probe in block 117 the user is able to locate a physical fault in the cabling.

The method of FIG. 6 additionally comprises block 119 which indicates that after link signals have been found and identified, then the link tester generates a link pulse pattern for transmitting to the link partner. Thereby the link partner will indicate that this pattern of link pulses is being received. For example, the link tester may send a pattern of link pulses causing an indicator light to flash at the link partner. If the link partner is a NIC then an LED on the NIC may flash according to the pulse pattern. This visually verifies that the link is properly functioning. In a similar manner, if the link partner is a hub or router in a network closet, then the hub or router may have a light responding to the link pulse pattern so that a computer technician in the computer closet may quickly visually identify the cable connection to the target LAN port.

However, due to variations in the logic used to drive the link indicator, some network and computer devices will not properly respond to a symmetrical link pulse pattern. Transmitting a symmetrical pattern will cause the link indicator light to either be continuously "on" for some devices and continuously "off" for other devices. Therefore, a technician cannot verify a communication link has been established.

Therefore, the alternate link tester utilizes an asymmetrical pattern of transmitting link pulses to provide the broadest compliance with link indicator light logic on various network or computing devices. For example, a preferred asymmetrical link pulse may consist of transmitting a link signal for 512 milliseconds, turning off the link signal for 512 milliseconds, turning on the link signal for 1,536 milliseconds, and then turning off the link signal for 1,536 milliseconds. This asymmetrical pattern is then repeated as described above thereby causing the indicator light on the far end device to show a link has been established.

Finally, if the link partner has an auto negotiation feature thereby permitting two or more operational modes, the method of FIG. 6 adds additional features. As in the previous method of FIG. 5, if multiple operational modes are found the link tester will illuminate two or more of the operational mode indicators as indicated in block 120. When it is detected in block 121 that multiple operational modes are available to link partner, then in block 122 the link tester generates an appropriate responsive link signal. The responsive link signal may include a link code word for configuring the link partner to a single operational mode. The generated link signal is transmitted to the link partners, thereby setting the configuration for the link partners. This verifies the auto negotiation function of the link partner.

For example, the link tester may determine that the link partner is an auto negotiating device which may be set to any of the four indicated operational modes. In such a manner all four operational mode lights will be illuminated. After a period of time, for example two seconds, the link tester may send an appropriate link signal to the link partner to configure the link partner to 100 megabits per second in half duplex. Thereby, the link partner will then respond with the appropriate link signal indicating the link partner is set to 100 megabits per second half duplex. At this point, the display of the link tester will change to have only the "100 TX" indicator light illuminated. The computer technician has now verified the functioning of the auto negotiation feature of the link partner.

Figure 7A:
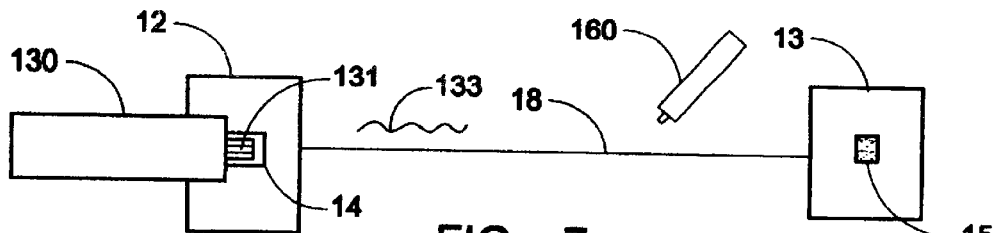
FIGS. 7a, 7b, and 7c are block diagrams demonstrating the use of an alternate embodiment of a link tester made in accordance with the present invention.
Figure 7B:
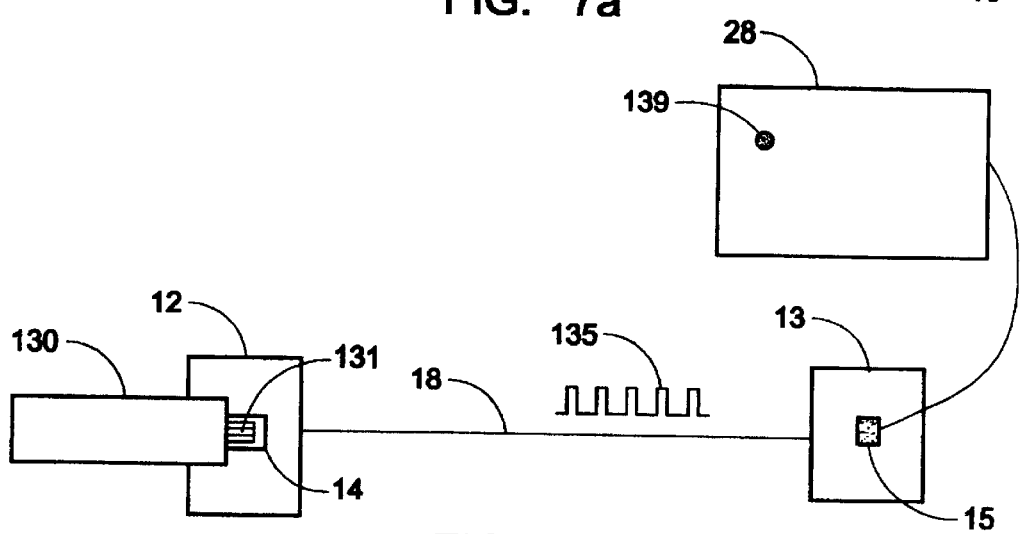
Figure 7C:
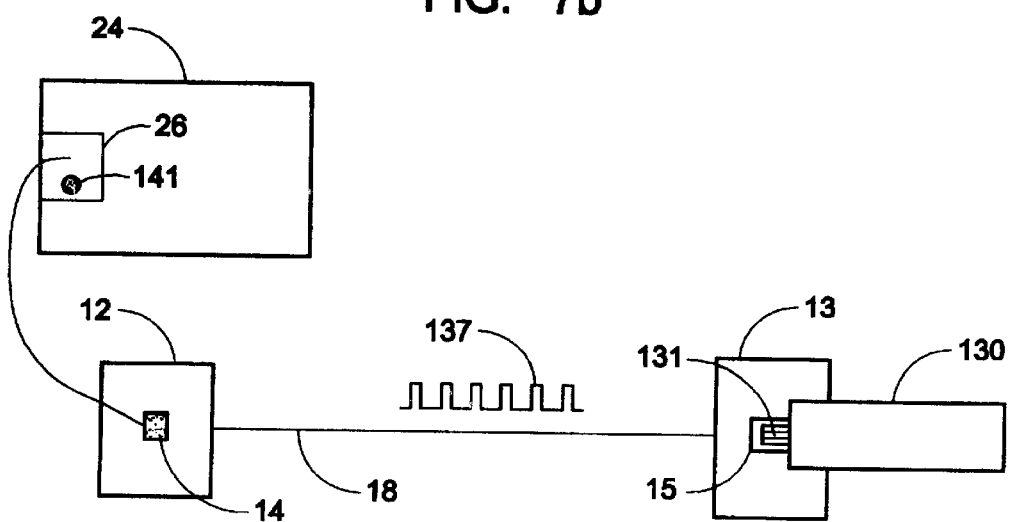
Figure 8A:
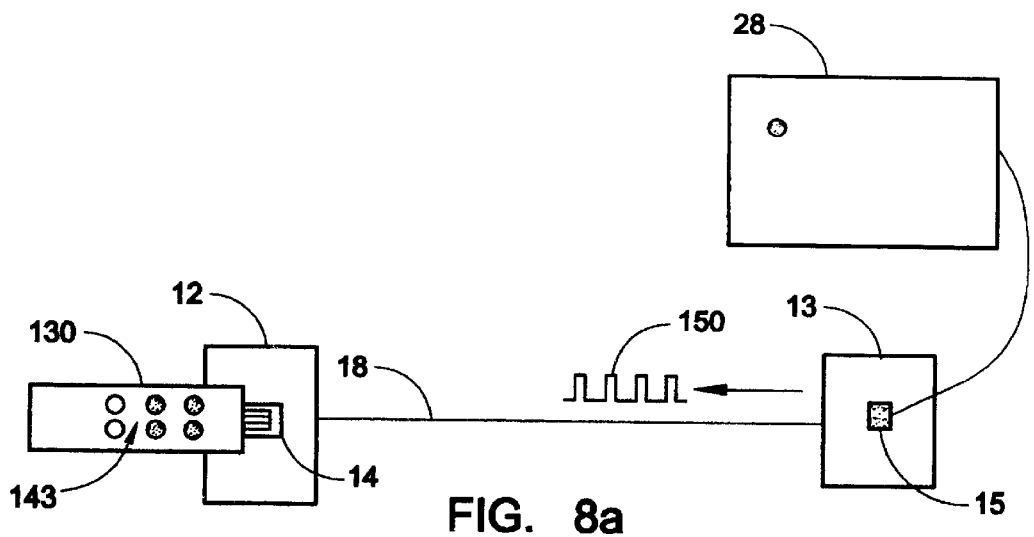
FIGS. 8a, 8b and 8c are block diagrams showing an alternate link testing made in accordance with the present invention that is testing the auto-negotiation capability of a far end device.
Figure 8B:
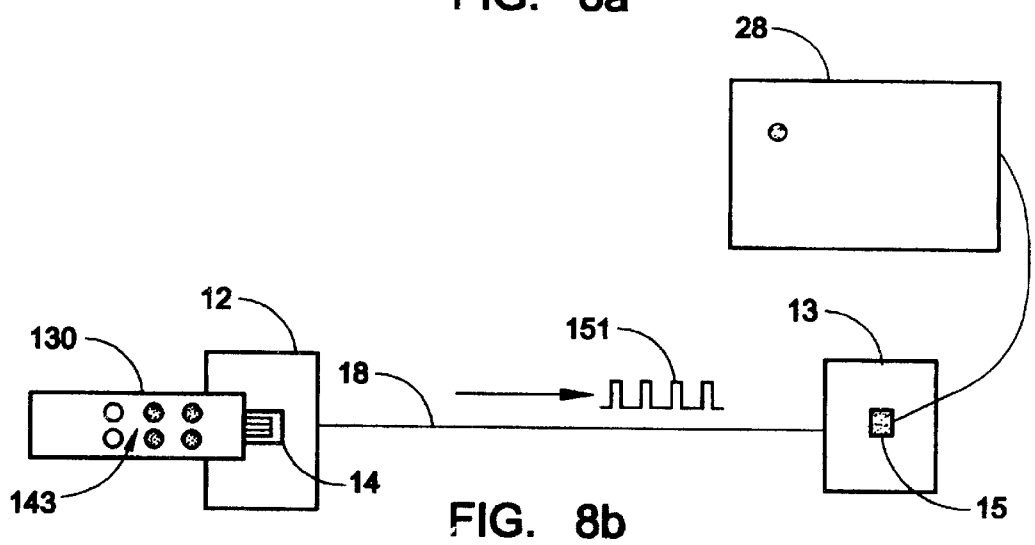

FIGS. 7 and 8 present examples of an alternative link tester 130 generating link signals in response to received link signals. FIG. 7a shows the link tester 130 coupled to the network cable 18 by inserting the RJ-45 plug 131 into RJ-45 jack 14 on wall socket 12. There is no far end device at the other end of the line at wall socket 13. Thereby, the link tester 130 will not find any link signals on either the network transmit pair or node transmit pair pairs. When the link tester 130 determines no link signals are present, the link tester 130 generates a tone 133 and transmits the tone 133 on both the node transmit pair and network transmit pair pairs. In such a manner, a user may use tone probe 160 to detect a physical fault in the cabling.

FIG. 7b shows the link tester 130 coupled to the cable 18 with a network device 28 attached at the far end. Upon scanning the network transmit pair link, the link tester 130 will find appropriate link pulses identifying the network device. Upon finding the network 28 device, the link tester 130 generates a link pulse pattern 135 and transmits the link pulse pattern 135 to the network device 28. Upon receiving the link pulse pattern 135 the network device 28 has a link indicator light 139 which flashes. By visually monitoring the link light 139 a computer technician can identify which input to the network device 28 couples to the RJ-45 jack 14.

In a similar manner FIG. 7c shows a link tester 130 coupled to the network with a computing device at the far end. The link tester 130 will first check the network transmit pair and find no link signals. Subsequently, the link tester 130 will scan the node transmit pair and will find link signals. Upon detecting and identifying the link signals, the link tester 130 generates a link pulse pattern 137 and transmits the link pulse pattern 137 to the NIC card 26 within the computer 24. The NIC card 26, upon receiving the link pulse pattern 137, causes a link indicator light 141 to illuminate. Thereby, a computer technician is able to verify the communication link to a NIC within a computer.

The tester 130 may also verify the auto-negotiation feature of a far end link partner is properly functioning. For example, FIG. 8a shows the link tester 130 coupled via network cable 18 to a computing device 28. The far end device 28 is sending a link signal 150 that is received by the link tester 130. The link tester 130 scans the pair and identifies available operational modes. As can be seen from the display 143, the link tester has determined that the network device 28 has four modes of operation available, as the display 143 has four illuminator indicator lights. Since multiple modes of operation are available, the far end network device 28 is an auto-negotiation device.

After displaying the available operational modes for a few seconds, the link tester 130 responds with an appropriate link signal 151 as shown in FIB. 8b. The responsive link signal 151 is generally a link code word to the network device 28. The link code word, is for configuring the network device 28 to one of the available operation modes. In response to the link code word 121, the network device 28 configures itself to one particular operational mode.

Figure 8C:
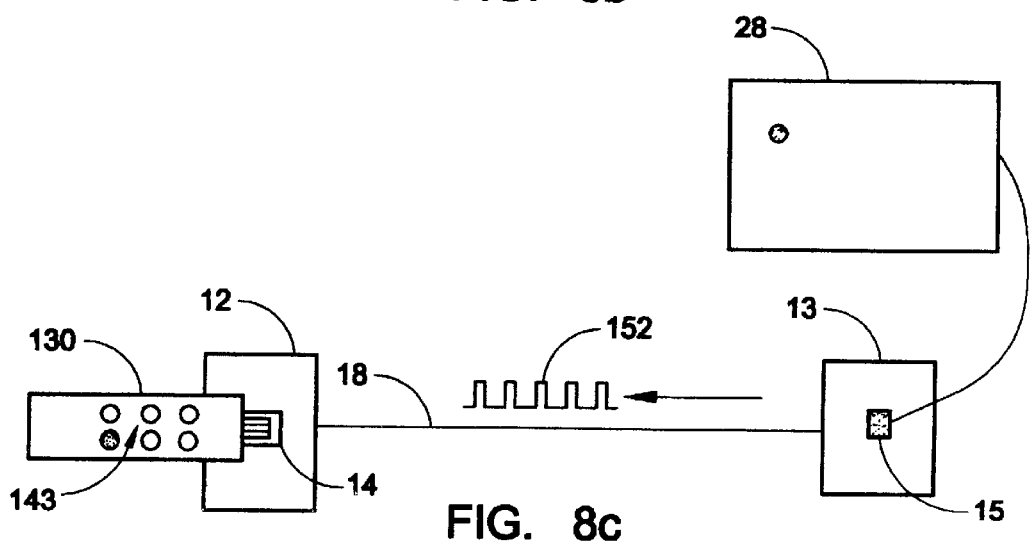

Upon setting the particular operational mode, the network device 28 sends link signal 152 back to the link tester 130 as shown in FIG. 8c. Upon receiving the updated link signal 152, the tester 130 now indicates a single mode of operation on display 143. Thereby, the computer technician verifies that the auto-negotiation feature of the far end device is operating properly.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A LAN link tester, comprising a housing;

an input connector for coupling to a LAN port, the input connector configured to couple to a network transmit pair line of the LAN port and a node transmit pair line of the LAN port;

detection means for detecting link signals coupled to either the network transmit pair line or the node transmit pair line;

line selection means for selectively and automatically coupling the detection means either to the network transmit pair line or to the node transmit pair line;

circuit means for causing the line selection means to couple the network transmit pair line of the LAN port to the detection means, and if no link signal is detected, to automatically couple the node transmit pair line of the LAN port to the detection means, and responsive to a detected link signal determining available operational modes or a fault condition; and display means on the housing for displaying an indicia indicative of the operational modes or the fault conditions.

2. The LAN link tester of claim 1 where the input connector is an RJ-45 connector attached to the housing.

3. The LAN link tester of claim 1 where the link signals are a burst of fast link pulses to transmit a link code word that defines configured capabilities.

4. The LAN link tester of claim 1 where the link signals are a parallel detection signal in the form of a continuous MLT-3 waveform.

5. The LAN link tester of claim 1 where the link signals are normal link pulses.

6. The LAN link tester of claim 1 further comprising a tone generator means for generating and transmitting an electronic tone signal on the network transmit pair line and the node transmit pair line when no link signal is detected.

7. The LAN link tester of claim 1 further comprising pattern generation means for generating a pattern of link pulses that cause a link partner to indicate that the pattern of link pulses has been received at the link partner.

8. The LAN link tester of claim 1 further comprising response link signal generation means for transmitting response link signals to a link partner, the response link signal for configuring the link partner to a single mode of operation.

9. A method of using a LAN tester to test the link capability of a local area network, comprising:

coupling the LAN tester to a node transmit pair line and a network transmit pair line at a port on the local area network;

scanning the node transmit pair line of the port and detecting any link signals thereon, and if none present, automatically scanning the network transmit pair line of the port and detecting any link signals thereon;

determining the available operational modes for any detected link signals; and displaying the available operational modes.

10. The method of using a LAN tester according to claim 9 further including generating and transmitting an electronic tone signal on the network transmit pair line and the node transmit pair line if no link signals are detected.

11. The method of using a LAN tester according to claim 9 where the available operation modes are 100BaseTX full duplex, 100Base TX half duplex, 10BaseT full duplex, and 10BaseT half duplex.

12. The method of using a LAN tester according to claim 9 further including generating and transmitting a link pulse pattern to a link partner so the link partner indicates the link pulse pattern is being received.

13. The method of using a LAN tester according to claim 9 further including generating and transmitting a link signal for configuring a link partner to an operational mode that is selected from the available operational modes for the link partner.

14. The method of using a LAN tester according to claim 13 where the selected operational mode is less than the maximum operational mode.

15. A link tester for testing a local area network from a LAN port comprising:

a housing;

displays means on the housing;

an RJ-45 connector on the housing for coupling to the LAN port, the LAN port cabled to an unknown far end termination of the local area network;

link signal detection means for scanning the cable to determine if the far end termination is a computer device or a network device, the determination being indicated by the display means;

link signal identification means for identifying the operational mode available at the far end termination, the available operational modes being indicated by the display means;

tone generation means for generating a tone on the cable if no device is found at the far end termination, the tone for use with a tone probe for finding a physical fault on the cable;

link signal pattern generation means for generating and transmitting a link signal pattern to a device at the far end termination, the link signal pattern causing the device to indicate that a communication link has been established; and responsive link signal generation means for generating and transmitting a responsive link signal to the device at the far end termination, the responsive link signal for configuring the device to a single operational mode selected from the available operational modes.

16. The link tester according to claim 15 where the link signal pattern is an asymmetrical link signal pattern.

* * * * *